(12) United States Patent
Miccoli et al.

(10) Patent No.: US 8,809,120 B2
(45) Date of Patent: Aug. 19, 2014

(54) METHOD OF DICING A WAFER

(75) Inventors: Giuseppe Miccoli, Munich (DE); Adolf Koller, Regensburg (DE); Jayachandran Bhaskaran, Neufahrn (DE)

(73) Assignee: Infineon Technologies AG, Neubiberg (DE)

( * ) Notice: Subject to any disclaimer, the term of this patent is extended or adjusted under 35 U.S.C. 154(b) by 54 days.

(21) Appl. No.: 13/029,984

(22) Filed: Feb. 17, 2011

(65) Prior Publication Data

US 2012/0211748 A1    Aug. 23, 2012

(51) Int. Cl.
*H01L 21/301* (2006.01)

(52) U.S. Cl.
USPC ........................................................ 438/113

(58) Field of Classification Search
USPC .......... 438/110, 113, 118, 798; 257/E23.001, 257/E21.599
See application file for complete search history.

(56) References Cited

U.S. PATENT DOCUMENTS

| | | | | |
|---|---|---|---|---|
| 6,075,280 | A * | 6/2000 | Yung et al. | 257/620 |
| 7,087,452 | B2 * | 8/2006 | Joshi et al. | 438/68 |
| 7,955,955 | B2 * | 6/2011 | Lane et al. | 438/465 |
| 8,071,429 | B1 * | 12/2011 | Qian et al. | 438/113 |
| 2005/0277270 | A1 * | 12/2005 | Yoshikawa et al. | 438/463 |
| 2007/0066044 | A1 | 3/2007 | Abe et al. | |
| 2007/0257365 | A1 * | 11/2007 | Lu et al. | 257/737 |
| 2007/0293020 | A1 * | 12/2007 | Pressel et al. | 438/463 |
| 2008/0094087 | A1 | 4/2008 | Lee | |
| 2008/0121819 | A1 | 5/2008 | Tanaka et al. | |
| 2008/0153264 | A1 * | 6/2008 | Nakamura et al. | 438/463 |
| 2008/0268619 | A1 * | 10/2008 | Nakamura | 438/463 |
| 2009/0121321 | A1 | 5/2009 | Miccoli et al. | |
| 2009/0121337 | A1 * | 5/2009 | Abe et al. | 257/686 |
| 2009/0215245 | A1 * | 8/2009 | Nakamura | 438/463 |
| 2009/0294913 | A1 | 12/2009 | Kawashima | |
| 2010/0015782 | A1 * | 1/2010 | Yu et al. | 438/463 |
| 2010/0047969 | A1 * | 2/2010 | Kim et al. | 438/113 |
| 2010/0127355 | A1 * | 5/2010 | Mariani et al. | 257/620 |
| 2010/0173474 | A1 | 7/2010 | Arita et al. | |
| 2010/0267219 | A1 * | 10/2010 | Kajiyama | 438/462 |

FOREIGN PATENT DOCUMENTS

| | | | |
|---|---|---|---|
| JP | 2005-340423 A | 12/2005 | |
| JP | 2008-153638 A | 7/2008 | |
| JP | 2010-016361 A | 1/2010 | |
| JP | 2010-093187 A | 4/2010 | |

* cited by examiner

*Primary Examiner* — Michele Fan
(74) *Attorney, Agent, or Firm* — Slater & Matsil, L.L.P.

(57) ABSTRACT

A method of dicing a semiconductor wafer includes forming a layer stack on a first main surface of a substrate. The layer stack and a portion of the substrate are etched according to a pattern defining an intended dicing location to obtain a trench structure. The substrate is irradiated with a laser beam to locally modify the substrate between a bottom of the trench structure and a second main surface of the substrate opposite to the first main surface.

4 Claims, 14 Drawing Sheets

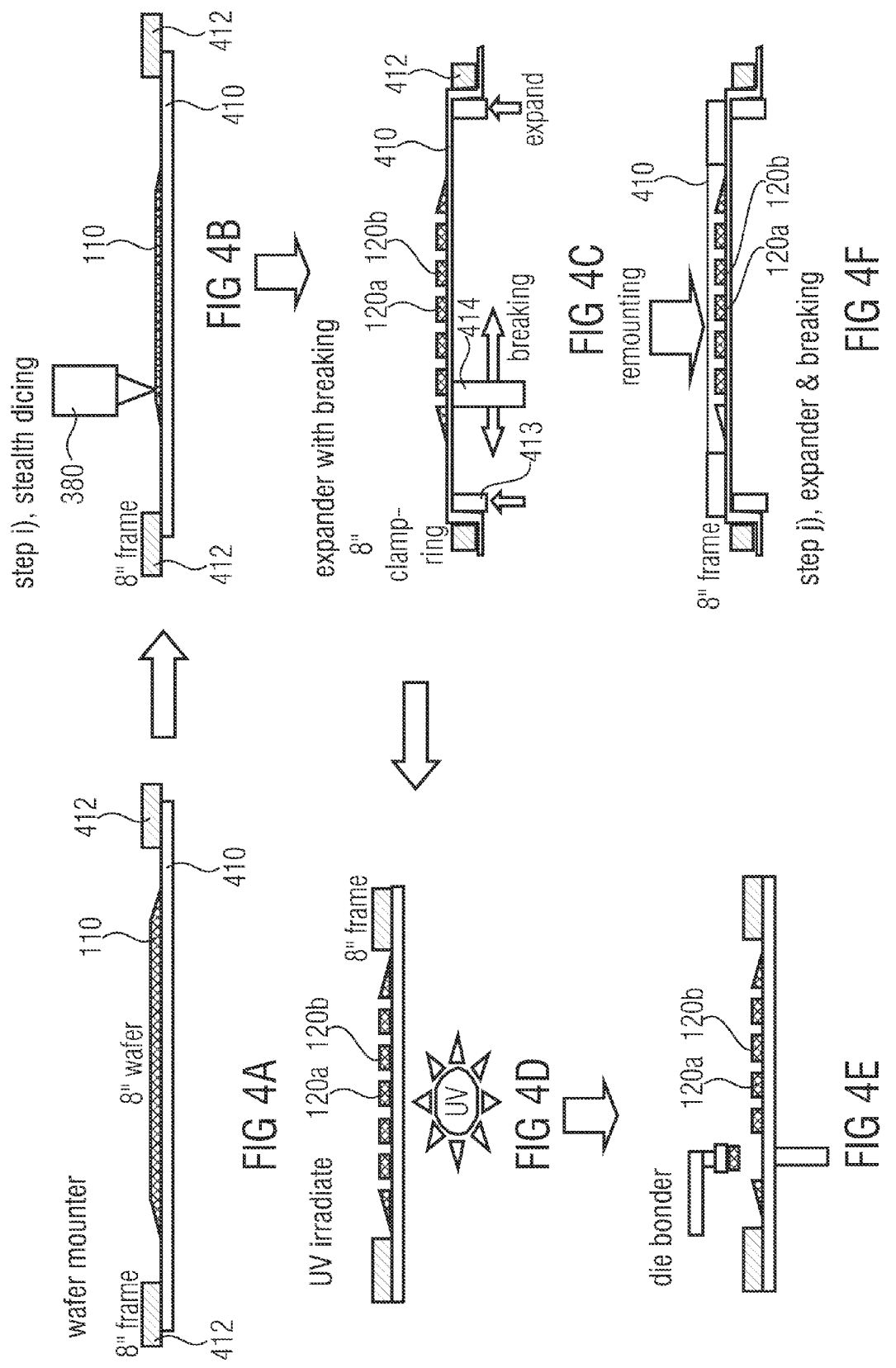

METHOD OF DICING A WAFER

TECHNICAL FIELD

The present invention relates generally to device processing and in particular embodiments to a method of dicing a wafer.

BACKGROUND

Some embodiments according to the invention are related to a method of dicing a semiconductor wafer. Some embodiments according to the invention are related to a wafer as an intermediate product during the method of dicing the wafer. Some embodiments according to the invention are related to a semiconductor device obtained from the method of dicing a wafer.

The semiconductor integrated circuits (or devices, or chips) that are manufactured on wafers typically need to be kept apart from each other by a given distance. This distance is called dicing street, scribe-line, kerf, dicing channel, etc.

This distance is needed so that the singulation process that is normally based on a disruptive mechanical sawing process can be performed without damaging the circuits. The sawing process is normally conducted by means of a rotating diamond circular blade. In recent times, a prescribing process assisted by an ablation laser is utilized. The kerf, which surrounds each chip on its four sides has a width which varies from technology to technology. By making use of conventional blade dicing and taking into account the stringent manufacturing quality and reliability requirements of today's mass production standards (e.g., Zero Defect Policies), the narrowest available kerf released in production appears to be approximately 62 µm wide.

The area required for the kerf is typically destroyed during the dicing process. For this reason, temporary structures may often be found in the kerf area. For example, within the space of the kerf, a number of structures necessary to control the manufacturing operations may be placed. Such structures comprise the typical process control monitor electrical test structures (PCM), the photolithographic alignment structures, the wafer level reliability test circuits, the film thickness and critical dimension (CD) measurement structures, etc. When the mechanical rotating blade-assisted dicing operation is performed, the wafer state of the kerf is wasted and mentioned test structures are destroyed. The width of the kerf is essentially determined by the following factors: The width of the dicing blade, the width of the test and measurement structures plus margins for quality and reliability concerns.

When making use of mechanical rotating blade-assisted dicing, the following observations can typically be made:

The smaller the area of the chip, the higher the percentage of wafer material wasted in the kerf.

The edges of the singulated die are particularly rough and there is a high risk of chipping of the upper films of the chip.

Micro-cracks can be easily generated which propagate within the integrated circuit (which can pose reliability constraints); consequently, the integrated circuit has to be protected from crack issues by means of "crack stop" structures, which, in turn, increase the chip area.

Generation of wafer dust (generally silicon) that can lead to discoloration/corrosion of the input/output circuit pads (generally made of aluminum).

The utilization of water, intended to cool down the blade and wash out the dirt, can lead to corrosion of the aluminum of the pad.

The dicing has to be performed along perpendicular and/or rectangular kerf lines.

During the last few years, a new sawing/dicing technology has emerged in the industry, known as Stealth Dicing, which relies on a laser beam to perform the singulation of the dies. The main characteristic of such a Stealth Dicing technology is that the laser beam is focused at a selectable depth within the bulk of the wafer. The energy carried by the laser beam is therefore capable of locally modifying the morphology of the crystalline wafer (e.g., silicon, GaAa, etc.) from mono-crystalline to poly-crystalline. As a result, a precisely localized line of mechanical stress is introduced within the bulk of the wafer at the selected depth. Once the wafer has been processed through the Stealth Dicing tool, it is still not yet singulated. In order to separate each die from its neighbor, it is necessary to apply a controlled mechanical expansion of the wafer; such an operation is performed in a separate module of the Stealth Dicing machine called expander.

SUMMARY OF THE INVENTION

A method of dicing a semiconductor wafer according to the teachings disclosed herein comprises forming a layer stack on a first main surface of a substrate. The layer stack is etched and a portion of the substrate according to a pattern defining an intended dicing location to obtain a trench structure. The substrate is irradiated with a laser-beam to locally modify the substrate between the bottom of the trench structure and the second main surface of the substrate opposite to the first main surface.

In another embodiment according to the teachings disclosed herein, a method of dicing a semiconductor wafer comprises forming a layer stack on a first main surface of a substrate. The layer stack comprises a metal region at an intended lateral dicing location and a final passivation layer. A photoresist layer is formed on the final passivation layer. A photolithographic process is performed to selectively remove the photoresist layer at a location that is substantially laterally aligned to the metal region. The final passivation layer is etched at the location that is substantially laterally aligned to the metal region. The metal region of the layer stack is etched to expose the first main surface of the substrate at the intended lateral dicing location. The substrate is etched through an opening in the layer stack obtained during the etching of the metal region to obtain a trench structure in the substrate. The substrate is irradiated with a laser beam to locally modify the substrate between a bottom of the trench structure and a second main surface of the substrate opposite to the first main surface. Individual chips are singulated from the wafer.

In another embodiment according to the teachings disclosed herein a wafer comprises a substrate, a layer stack arranged on a first main surface of the substrate, a trench structure in the layer stack and in a portion of the substrate, and a modified substrate region located between a bottom of the trench structure and a second main surface of the substrate. The layer stack may comprise at least one conductive interconnection layer. The trench structure may act as a boundary of at least one chip region of the wafer.

Another embodiment according to the teachings disclosed herein provides a semiconductor device comprising a substrate, a layer stack, and a modified substrate region. The substrate comprises a first main surface, a second main surface opposite to the first main surface, and a lateral substrate surface. The layer stack is arranged on the first main surface of the substrate and comprises a lateral layer stack surface. The lateral layer stack surface is aligned to the lateral substrate surface. The modified substrate region is located at the lateral substrate surface between the first main surface and the second main surface.

BRIEF DESCRIPTION OF THE DRAWINGS

The features of the embodiments of the teachings disclosed herein will be more readily appreciated and better understood by reference to the following detailed description, which should be considered with reference to the accompanying drawings, in which:

FIG. 1, illustrate the principle of the Stealth Dicing technology;

FIGS. 4A-4F, collectively FIG. 4, show a partial process flow for the Stealth Dicing and expansion actions;

Figure 1A:
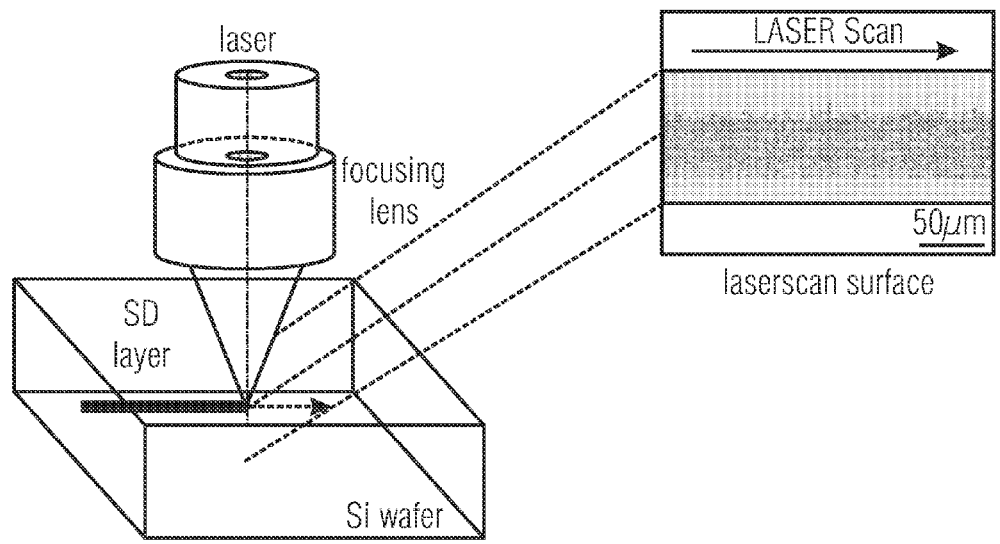
FIGS. 1A-1C, collectively

Before embodiments of the present invention are explained in more detail below with reference to the drawings, it is to be noted that equal elements, or those operating in an equal way are provided with same or similar reference numerals and figures, and that a repeated description of these elements is omitted.

DETAILED DESCRIPTION OF ILLUSTRATIVE EMBODIMENTS

FIG. 1 shows an explanation of the Stealth Dicing tool and process that may be used in the context of the teachings disclosed in this document.

FIG. 1A shows how a laser beam may be focused by means of a focusing lens so that the focal point is at a selected depth within the bulk of a silicon wafer. The laser beam may be moved across the silicon wafer to form an elongated modified wafer region. In FIG. 1A the laser is moved from the left to the right as indicated by the dotted arrow. Thus, the modified wafer region has been created to the left of the focal point of the laser beam and is about to be created to the right of the focal point of the laser beam. The laser may be operated in a continuous manner, but typically the laser is pulsed so that short laser pulses interact with the silicon of the wafer in the vicinity of the focal point. An inset to the right in FIG. 1A shows a laser scan surface resulting from focusing the laser beam at the selectable depth within the bulk of the silicon wafer and moving the laser beam in the indicated direction (arrow labeled "LASER scan"). It can be seen that a relatively well-defined modified region can be obtained while the surrounding silicon material is substantially unaltered.

Figure 1B:
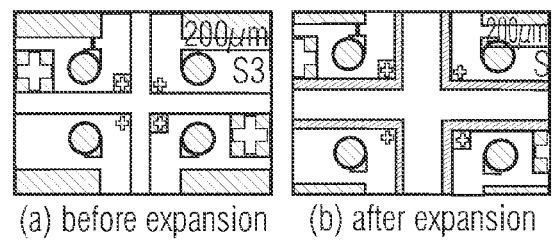

FIG. 1B shows a top view of an intersection of two scribe-lines or kerfs before and after expanding the wafer.

Figure 1C:
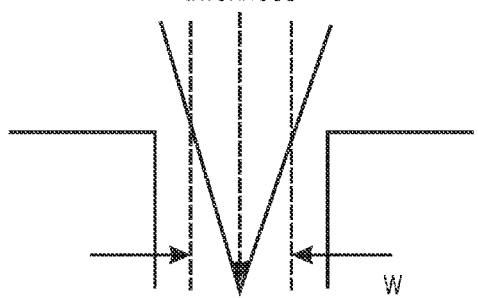

FIG. 1C shows a schematic cross-section through a kerf region after the wafer has been expanded. The saw street or scribe-line width (w) can be empirically estimated with the formula w=0.30×(Wafer thickness) to w=0.40×(Wafer thickness). Therefore, if a wafer, as thick as 300 µm, needs to be Stealth diced by irradiating it from the top surface, w has to be in the range of 90-120 µm. In order to avoid undesired refraction or reflection of a laser beam, this minimum width (w) has to be kept normally free from materials other than silicon/silicon dioxide.

Focusing the laser beam into the silicon wafer predetermines a breaking line. The actual singulation is then caused by subsequent tape expansion supported by a breaking tool. Multiple passes of the laser beam focused at different depths within the bulk of the wafer will induce a well-controlled and accurately positioned stack of stress-lines one on top of the other.

Figure 2:
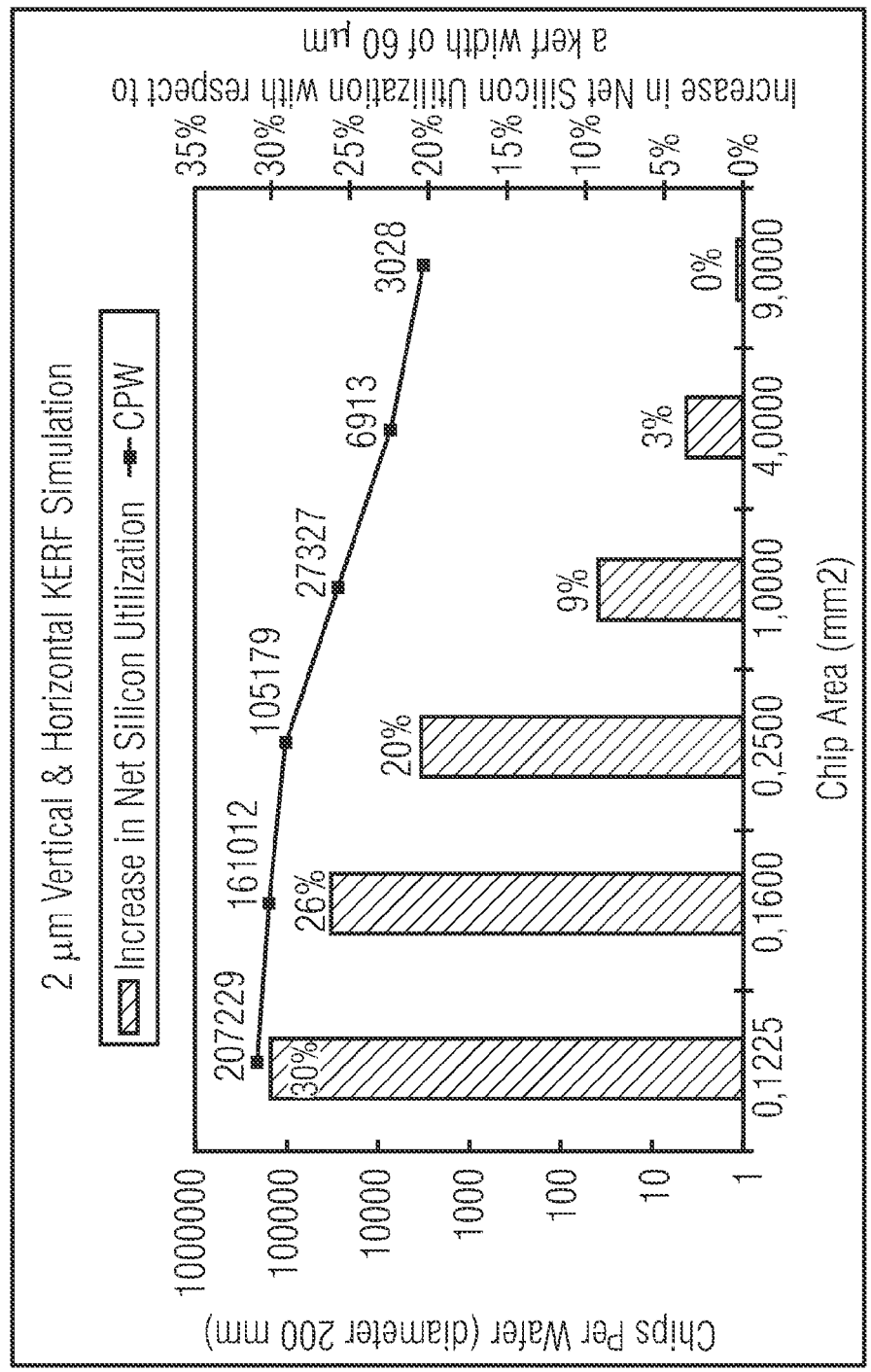
FIG. 2 displays an increase in net silicon utilization by using small scribe-lines.

In FIG. 2 a graph is provided which shows, as a function of chip area (i.e., the area of one individual chip after singulation), the increase in the number of chips per wafer by reducing the horizontal and vertical distance between adjacent integrated circuits or chips from a current reference value of 62 µm to a proposed width of 2 µm. The horizontal and vertical distance is also called "kerf width". The benefit of reducing the kerf width to 2 µm is most noticeable for small chip areas, such as a chip area of 0.1225 mm$^2$ or 0.16 mm$^2$. Using a wafer of 200 mm diameter, over 200,000 chips with a chip area of 1.1225 mm$^2$ can be obtained when a kerf width of 2 µm is used. This is about 30% more than the number of chips that can be obtained from the same wafer when a kerf width of 62 µm is used. The abbreviation CPW in FIG. 2 means "chips per wafer".

Embodiments of the teachings disclosed herein may make use of an additional lithography masking layer. This additional photolithography masking layer is named KE mask (KE=kerf etch).

According to one aspect of the teachings disclosed herein, a utilization of a wet etching process of metals is executed in a first part of dicing the wafer. Briefly, the following steps may be performed in the context of this aspect of the teachings disclosed herein.

During the manufacturing process of a wafer, a stack of metal (or other conducting materials) layers is constructed, wherein the stack of metal layers may be shaped as lines around the chip edges and (vertically) connected to each other by appropriate via-contacts. The via-contacts can, e.g., be shaped as slits. As a result, a continuous layer stack of metals that is as wide as the KE mask opening or as wide as the kerf-line can be constructed with the resulting stack of metal lines being aligned to the KE mask. An oxide plasma etch removes the last protective oxide or nitride layer (e.g., a passivation layer) and exposes the top metal layer. A wet etch based on, for example, hydrogen peroxide, sulfuric acid and water (called Piranha) can selectively etch away the photoresist (comprising, e.g., an organic material) as well as the stack of metal layers. Such metals can be aluminum, copper or tungsten. Finally, a slit as wide as the KE mask opening will result and the slit separates the chips from the wafer (silicon) surface.

A dry plasma etch of the single crystal silicon wafer (substrate) is then performed, which etches a slit around the integrated circuit chip in the silicon. For this etching step an anisotropic etching can be used so that neighboring circuits in the wafer remain intact.

The wafer is then irradiated by means of a laser beam, for example, from the backside. The laser beam is focused at a selectable depth within the bulk of the substrate to form a modified substrate region in the vicinity of the focal point.

The wafer may then be expanded using an expander in order to finalize the singulation process.

By employing the Stealth Dicing technique, which makes use of a special laser beam, in combination with wet and dry plasma etching processing steps, the teachings disclosed herein seek to solve the problem of singulating the integrated circuits manufactured on semiconductor wafers which are separated by a very small distance (≤2 μm). In this way, the possible number of chips-per-wafer (CPW) and the surface utilization of the semiconductor wafers are both increased. As a consequence, the wafer manufacturing costs of the integrated circuits (chips) are reduced.

It has to be pointed out that in reducing the kerf width to the 2 μm, the test and monitor structures normally placed into the kerf can now be rearranged and placed, for example, into a space of one or more chips in the floor plan of the wafer, which is particularly economical for small chip sizes.

As another option to further reduce the distance separating any two integrated circuits on a wafer from, for example, 62 μm (in case of a kerf designed for mechanical blade dicing) to a much smaller value of ≤2 μm, the teachings disclosed herein propose the following solution.

During the manufacturing process of a wafer, a stack of metal layers shaped as lines of widths W (approximately 2 μm) around the chip edges and connected to each other by appropriate "via-bar" contacts is constructed. The "via-bar" contacts may actually be shaped as slits. As a result, a continuous stack of metals is constructed as wide as W (approximately 2 μm).

A dedicated lithography mask, named here KE (Kerf Etch) is aligned to this stack of metal lines. An oxide plasma etch removes the last protective oxide/nitride layer and exposes the top metal layer.

A wet etch based on hydrogen peroxide, sulfuric acid and deionized water (called Piranha) is applied to selectively etch away the organic photoresist as well as the stack of metals. Such metals are normally aluminum, copper, or tungsten, or alloys such as TiN, TaN and similar. As a result, a deep slit, as wide as the KE mask opening, will result which separates the chips from above the wafer silicon surface.

A dry plasma etch of the single crystal silicon wafer is then performed which etches a slit (also known as trench) around the integrated circuit.

The Stealth Laser dicing is applied from the backside of the wafer. An infrared camera of the Stealth Dicing tool will be capable to align the positioning of the laser beam(s) to the bottom of the slit/trench.

Hence, an aspect of the teachings disclosed herein makes use of the laser Stealth Dicing technique, applied from the backside of the wafer substrate, in combination with a wet etch of a metal stack followed by a dry plasma etch of the wafer substrate. The metal stack width can be made as narrow as 2 μm and below.

The proposed arrangement of established wafer semiconductor manufacturing technologies in conjunction with a new laser-assisted dicing technology can allow the singulation of integrated circuits, which are separated from each other by a very small distance (≤2 μm).

The proposed embodiment is based on a unique utilization of the wet etch of metals to execute the first of a 3-step cut between chips. The second step comprises a utilization of a dry plasma etch to etch into the wafer substrate. The third step is based on the utilization of the Stealth Laser dicing technology, typically from the backside of the wafer.

The relatively low costs of the used processes allow the economical implementation of a narrow scribe-line or kerf width which leads to lower chip manufacturing costs.

FIGS. 3A-3I show steps of a process flow of dicing a wafer 110 in accordance with an embodiment of the teachings disclosed in this document. Before the process steps are outlined, the wafer 110 is described in more detail with respect to FIG. 3A.

During the so-called BEOL processing steps, intended to build the metallization structures which connect the electrical nodes of the integrated circuit, a suitable stack of the same metals is constructed (named Metal Stack Kerf). Such stack of metals can be formed by making use of typical via-bar slits filled with the metals, exactly as the rest of the metallization and interconnect lines are built within the chip 120a, 120b. The metal stack has to be located just around all the sides of the chips and the region where the separation of the chips has to be performed.

Figure 3A:
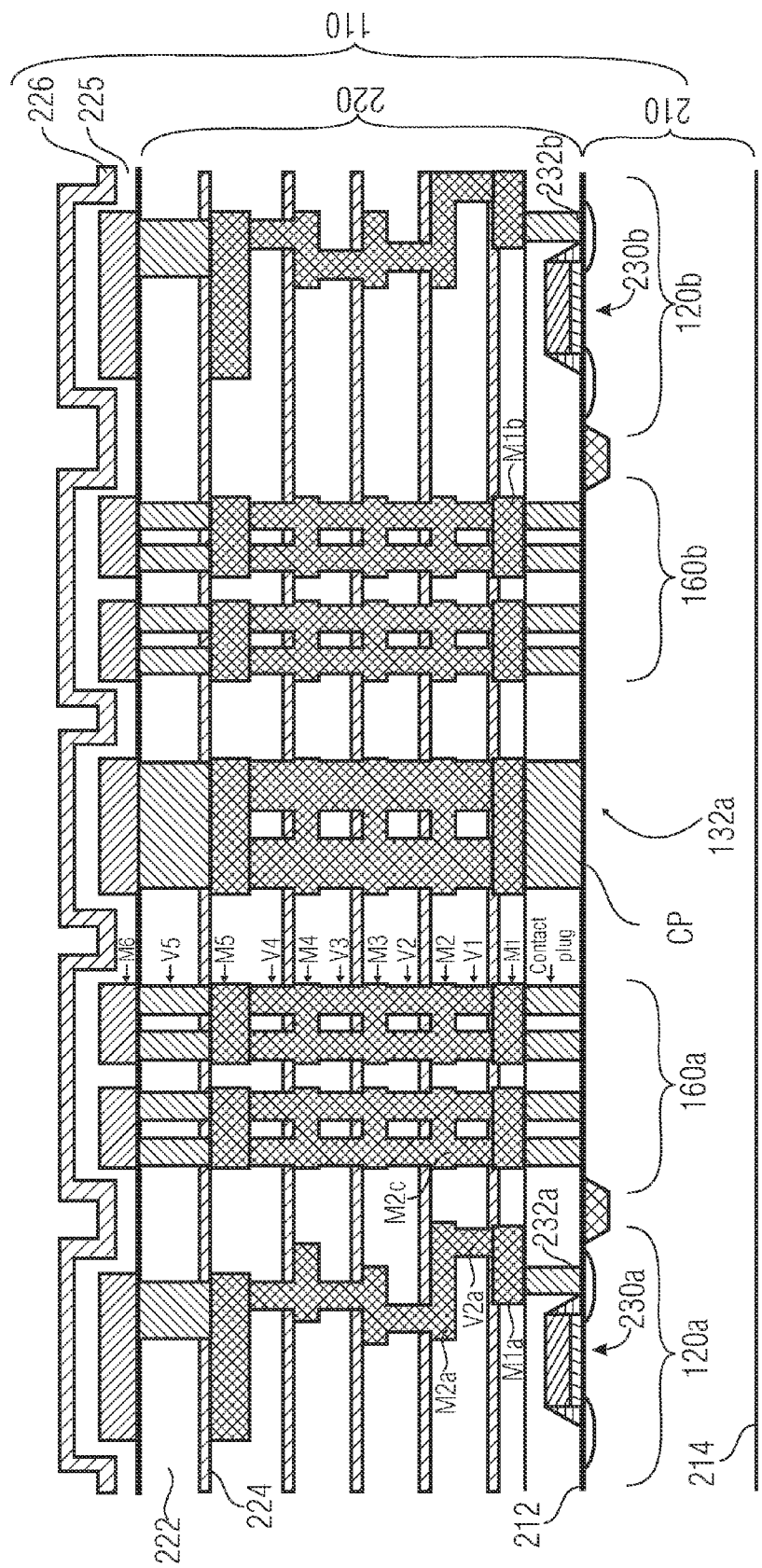
FIGS. 3A-3G show a possible process flow for dicing a wafer according to the teachings disclosed herein.

FIG. 3A shows a cross-section through the wafer 110. The cross-section goes through a first chip 120a and a second chip 120b. In FIG. 3A the first chip 120a is shown on the left-hand side and the second chip 120b is shown on the right hand side, wherein both chips are separated by a vertical kerf line region 132a. The wafer 110 comprises a substrate 210 with a first surface 212 and a second surface 214, wherein a layer stack 220 is formed on the first surface 212. The layer stack 220 comprises an assembly of layers of alternating first material 222 and a second material 224. The first material 222 comprises, for example, silicon oxide, and the second material 224 comprises, for example, a nitride. Along the layers of the second material 224 levels for metallizations are formed as metal layers M1, . . . , M6, which are separated by the first material 222. Each of the metal layers M1, . . . , M6 comprise different parts (a plurality of components) formed at laterally different places along the layer stack 220. For example, a first part of the first metal layer M1a is formed at the first chip 120a and a second part of the first metal layer M1b is formed at the second chip 120b, etc. The metal layers M1, M2, . . . , M6 can moreover be connected by via-contacts V1, V2, . . . , V5. For example, the via-contact V2a connects the metal layers M1a with M2a (in the first chip 120a). The first metal layer M1 can be connected to the substrate 210 by contact plugs CP. In the layer stack, the number of metallizations may be 1, 2, 3, 4, 5, 6, or more. The number of via layers is typically one less the number of metallizations.

In the embodiment as shown in FIG. 3A, there are six layers with the first material 222 separated by five layers with the second material 224. When viewed from the first surface 212 of the substrate 210, the last layer in the layer assembly 220 comprises an isolation layer 226 and a further isolation layer 225 which comprise, for example, a silicon oxide and a nitride. The combination of the isolation layer 226 and the further isolation layer 225 may serve as a final passivation of the wafer 210 and the layer stack 220. Of course, other numbers of layers 222, 224 may be used as well, and the sequence of the layers may be varied to the extent that more than two types of materials are arranged one upon the other. Accordingly, although in the following the number N of layers Mi 0≤i≤N is assumed to be 6, other numbers may be used as well. The substrate 210 comprises a first device 230a arranged in the first chip 120a and a second device 230b arranged in the second chip 120b. The first and the second device 230a and 230b can, for example, comprise a transistor with doped regions in the substrate 210 (comprising, for example, silicon). The first device 230a can be connected to the metal layer M1a by a first contact plug 232a and the second device 230b can be connected to the metal layer M1b by a second contact plug 232b. The metal layers M1a and M1b are in turn connected to the metal layers M2a, M3a, . . . , M6a and M1b, M2b, . . . , M6b by the via-contacts V1a, . . . , V5a and by V1b, . . . , V5b. The first chip 120a is sealed by a first seal ring 160a and the second chip 120b is sealed by a second seal ring 160b, wherein the first and second seal rings 160a and 160b each comprises two components of the metal layers M1, M2, ..., M6, which are connected by two components of the via-contacts V1, V2, ..., V5.

The seal rings 160a, 160b may be relatively small, for example, between 2 and 8 μm wide, preferably between 4 and 6 μm wide or approximately 5 μm wide. By comparison, the seal rings are between 20 and 30 μm wide in current semiconductor wafer structures.

In more detail, the metal layers Mi=(M1, M2, M3, ..., M6) comprise a plurality of components Mia, Mib, Mic, Mid, Mie and Mif (the index i=1, 2, ..., 6 counts the different levels). The metal layers Mia are arranged at the first chip 120a, the metal layer Mib are arranged at the second chip 120b, the third and fourth metal layers Mic and Mid are arranged at the first seal ring 160a and the metal layer Mie and Mif are arranged at the second seal ring 160b. The metal layers Mi are connected by the via-contacts Vi, wherein the component Via of the via-contacts Vi contact the metal layers Mia at the first chip 120a, the via-contacts Vib connect the metal layers Mib at the second chip 120b, the via-contacts Vic and Vid connect the metal layers Mic and Mid at the first seal ring 160a. The via-contacts Vie and Vif connect the metal layer Mie and Mif at the second seal ring 160b. In this way, the first surface 212 is connected with the last metal layer M6, which in turn is separated from the isolation layer 226 by a last part of the first material 222 (i.e., the further isolation layer 225).

Possible materials for the metal layers M1, M2, ..., M5 comprise aluminum or copper, the metal layer M6 can comprise aluminum, the via-contacts V1, V2, ..., V6 can comprise aluminum or copper. The via-contact V5 and the contact plugs CP can comprise tungsten. These are exemplary materials and other embodiments may comprise different materials. In addition, the numbers of layers as well as the number of metallizations differ in other embodiments.

In the situation depicted in FIG. 3A, the chips formed within the substrate 210, the stack 220 and isolation or passivation layer 226, 225 may be completely processed in that these chips merely need to be diced and no further processing regarding the schematics of a circuitry of the chips is necessary. Some portions of the upper metal layer M6 may form or may be contacted with contact pads, the contact pads not being shown in FIG. 3A in order to ease the understanding of FIG. 3A and the subsequent figures. The contact pads allow for an external contact of the circuitry of the chips and are left uncovered by the isolation layer 226 which otherwise overlays all chip areas.

Along the vertical kerf-line region 132a, the layer stack 220 comprises conducting materials from the first surface 212 to the last metal layer level M6. Hence, the kerf-line region 132a comprises a layer stack being formed, e.g., by a plurality of metal layers along the metal layers M1, M2, M3, ..., M6, which in turn can be connected by via-contacts V1, V2, ..., V5. On the last metal level M6, there are two isolation layers 225 and 226, which again protect the wafer 110. On the other side, a contact plug CP connects the first metal level M1 with the substrate 210.

A possible material of the six level M6 of metal layers is aluminum, the via-contacts V5 and the contact plug CP between the first metallic layer M1 and the substrate 210 can, for example, comprise tungsten and the material of the metal levels M1 to M5 as well as the via-contacts V1-V4 can, for example, comprise aluminum or copper.

After explaining the structure of the wafer, the actions of dicing are described next. In a first action of dicing the wafer 110, a KE resist layer 310 (see FIG. 3B) is deposited on the isolation layer 226. The KE resist layer 310 can, for example, comprise an organic material and is patterned by using a KE mask. In particular, the following actions may be performed. Forming a photoresist layer (KE) and performing a photolithographic process to selectively remove a photoresist KE above the Metal Stack Kerf.

Figure 3B:
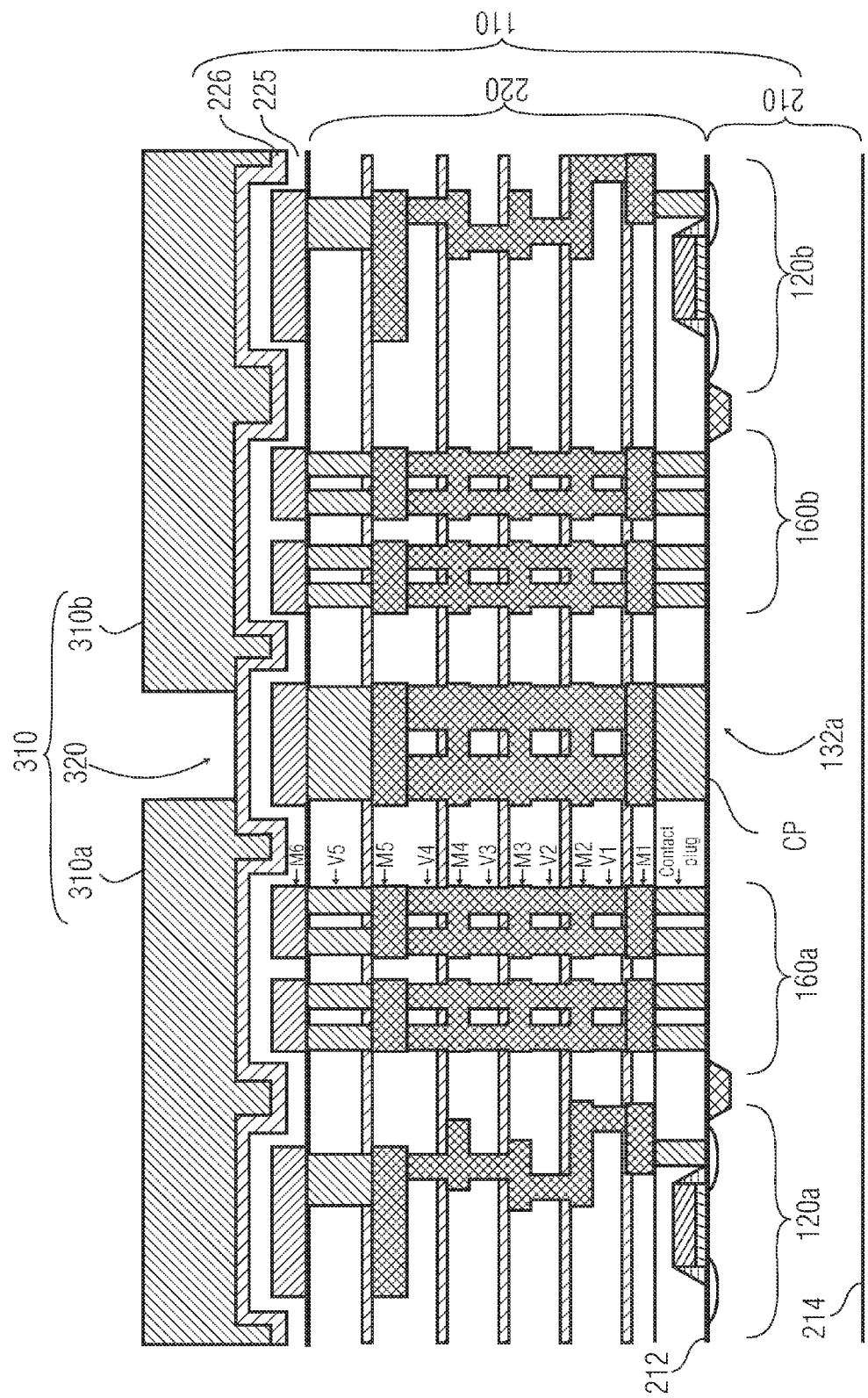

FIG. 3B shows a result of patterning of the KE resist layer 310 with a first part 310a and a second part 310b, which are separated by an opening 320 due to the patterning. The opening 320 is positioned along the vertical kerf-line 132a (which continues in the direction perpendicular to the drawing plane). The first part 310a of the KE resist layer is therefore formed on the first chip 120a with the first seal ring 160a, the second part of the KE resist layer 310b is formed on the second chip 120b with the second seal ring 160b, and along the opening 320, the isolation layer 226 is exposed. After the exposure of the isolation layer 226, a development can be performed to the first and second parts of the KE resist layers 310a, 310b. The patterning of the KE resist layer 310 can, for example, comprise an etching step.

Figure 3C:
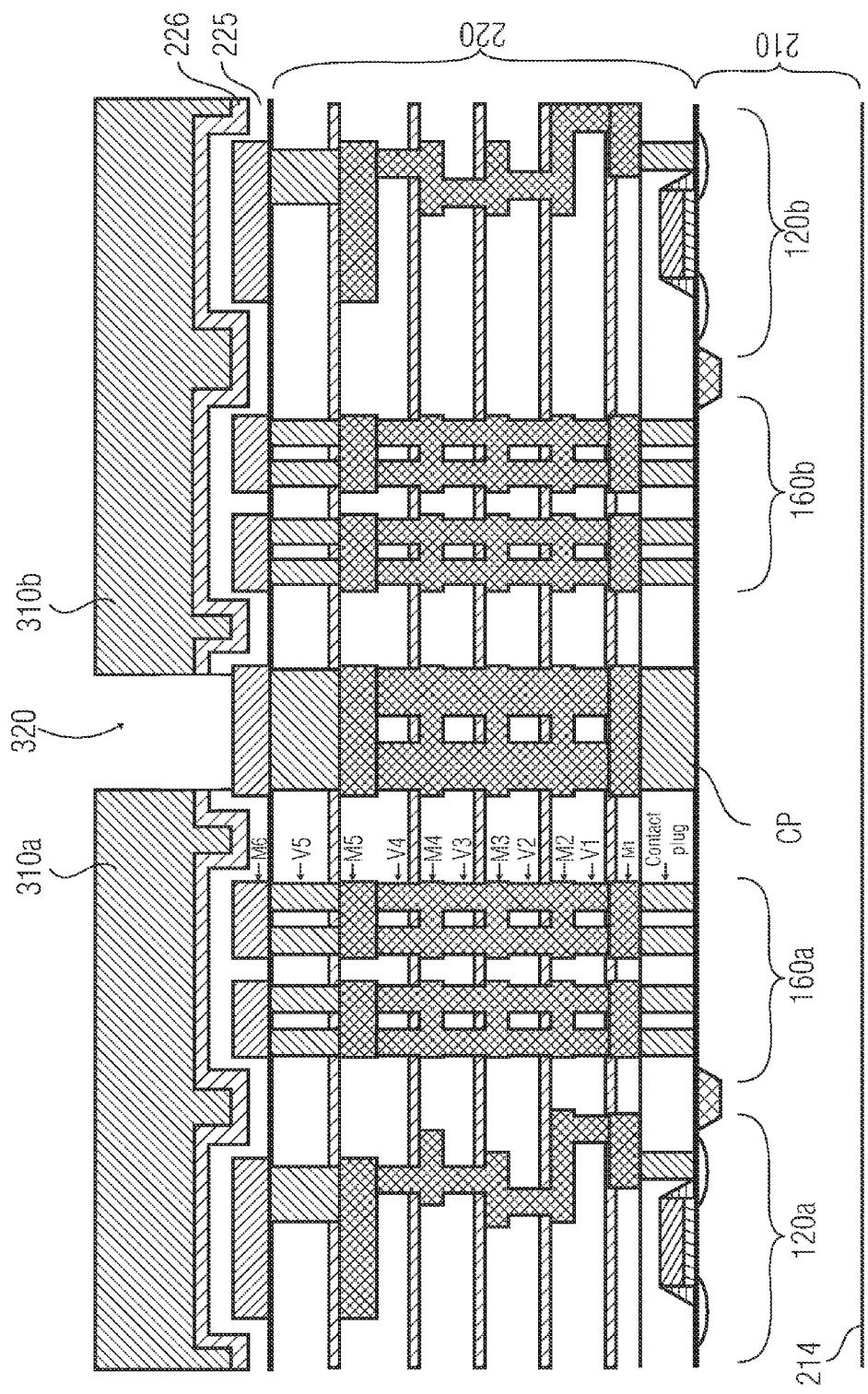

In FIG. 3C an action of selective etching is (or has been) performed in order to remove the isolation layer 226 and the further isolation layer 225 which comprise, for example, a silicon oxide and a nitride. As a consequence, the sixth level of metal layers M6 is exposed along the opening 320. In other words, a dry plasma etch (or, alternatively a wet chemical etch) may be performed to remove the final passivation dielectric layer(s) above the Metal Stack Kerf.

Figure 3D:
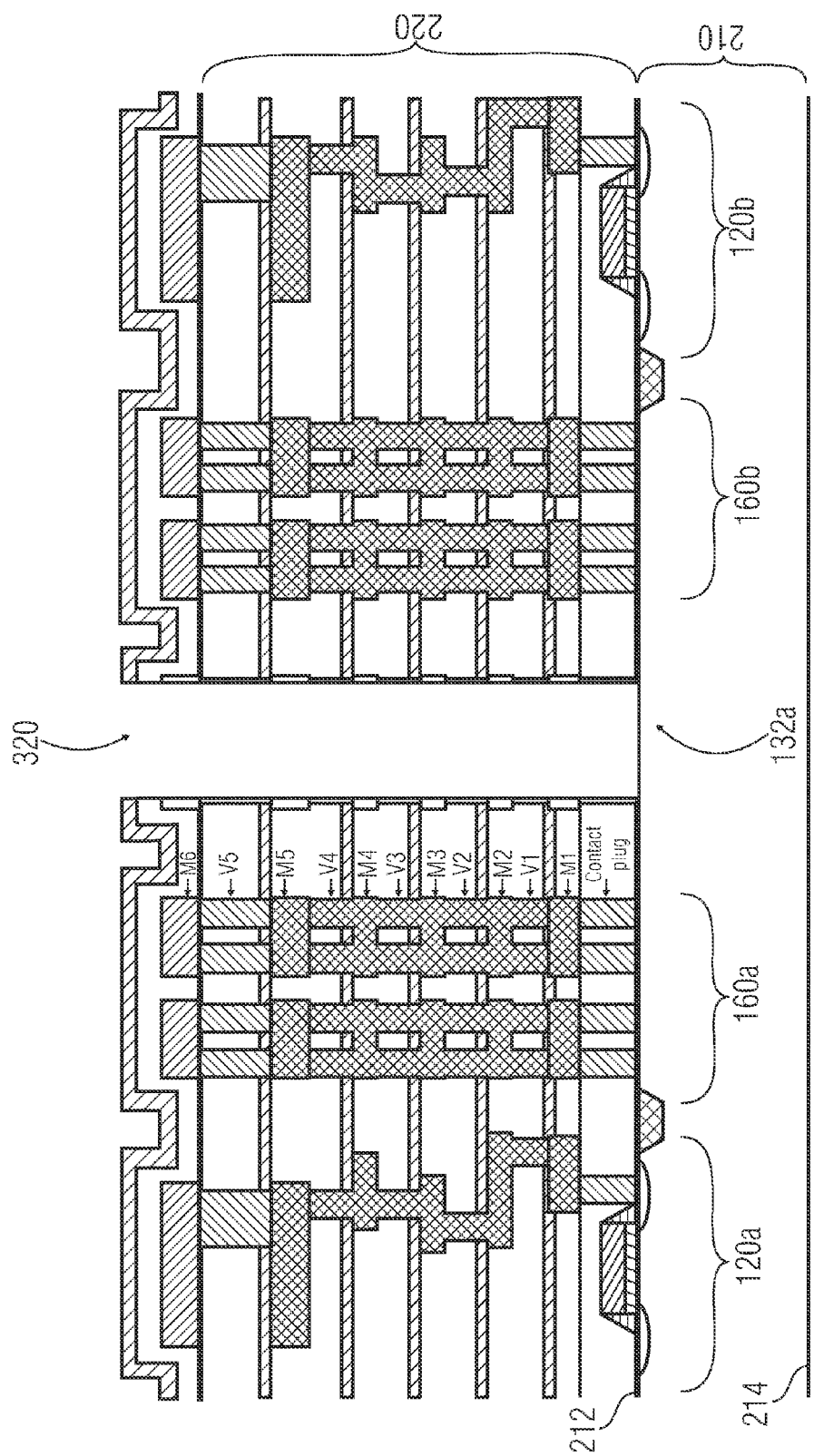

After the KE etch of the top oxide nitride layer, FIG. 3D shows an etch action in which the conducting material along the layer stack 220 is removed from the opening 320 to the first surface 212 of the substrate 210. Therefore, along the vertical kerf-line region 132a, the layer stack 220 of the first chip 120a with the first seal ring 160a is separated from the layer stack 220 of the second chip 120b with the second seal ring 160b. The step of removing the conducting materials along the vertical kerf-line region 132a can, for example, comprise an etching step, which selectively etches the metallic layers M6-M1, the via-contact V1-V5 and the contact plug CP, e.g., on the substrate 210. During this etching action, the substrate 210 can also be etched to a certain degree (not shown in this figure), so that also part of the substrate 210 is removed during this step.

The action of removing the conducting materials can, for example, comprise the KE kerf etch, wet etch, which is based, for example, on a chemical solution called Piranha, which selectively removes organic photoresists as well as metallics. Naturally, other chemical solutions may be applicable as well. At the time when the conducting material inside the opening 320 along the vertical kerf-line region 132a is removed, the KE resist layer 310 (or their parts 310a, 310b, etc.) can also be removed. This is possible by appropriately choosing the chemical solution.

Figure 3E:
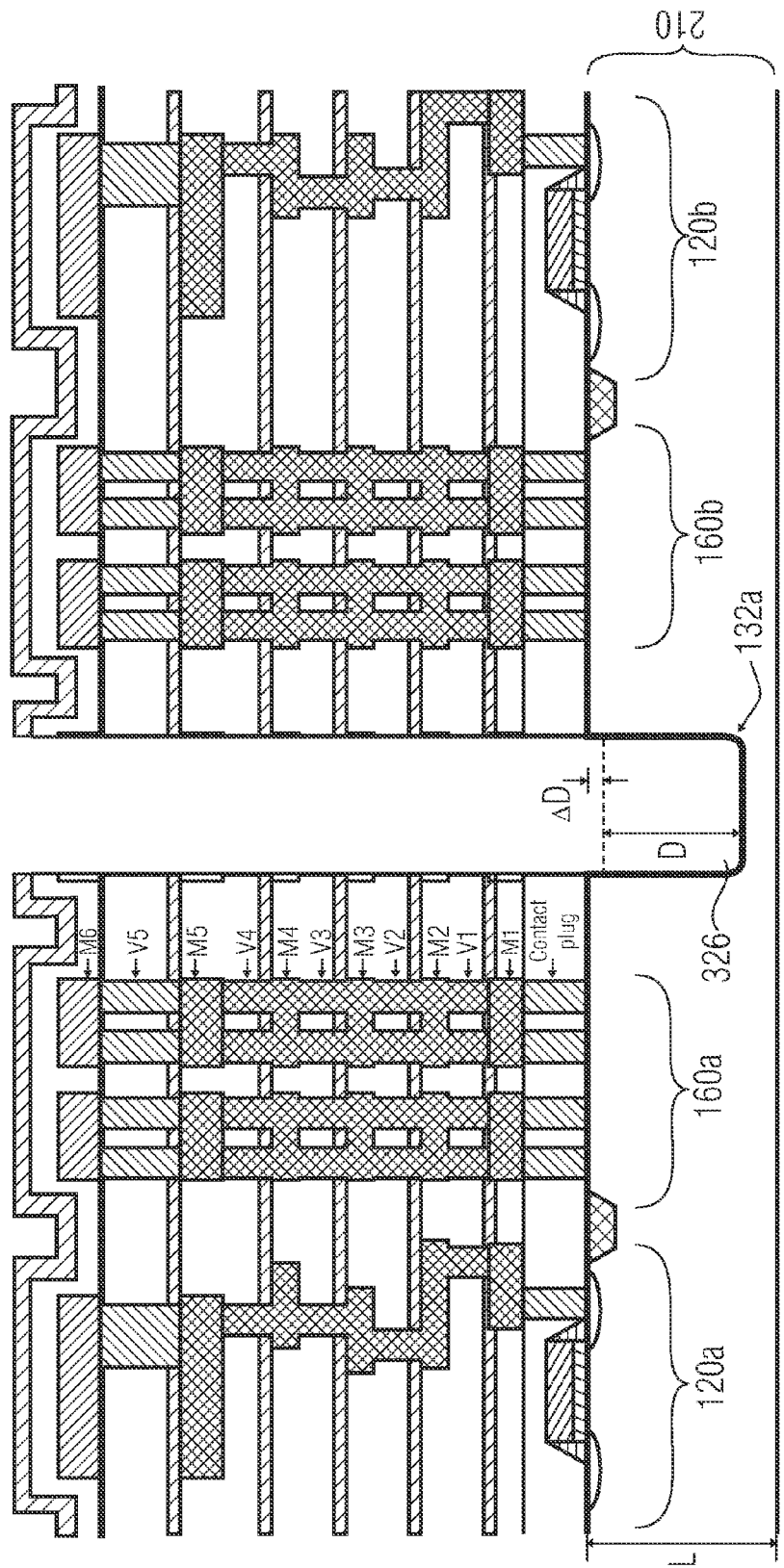

FIG. 3E shows a step in which a part 326 of the substrate 210 is removed, for example to a depth D which is, for example, smaller than the thickness L of the substrate 210. FIG. 3E also shows that during the etching step, which removes the metallic layers inside the layer stack 220, also a small amount of thickness ΔD of the substrate 210 is removed. This step can comprise an anisotropic etching which removes substrate material only along the vertical kerf-line region 132a, and can comprise a plasma etching step. Accordingly, the following actions may be carried out. Perform a wet chemical etch (based on a suitable solution of water-sulfuric acid-hydrogen peroxide, generally denoted as Piranha) to remove the photoresist and as well a full Metal Stack Kerf. Piranha is selective to silicon oxide and silicone nitride. As a result, the wafer substrate will be exposed. In other words, while the entire metal stack or pillar is removed, the surrounding oxide is not or only negligible affected by the wet etching process.

The trench structure may have a depth D of 10 to 50 µm, preferably 15 to 40 µm, and more preferably of 20 to 30 µm. The trench structure may typically have a minimum depth of 1 µm.

With a depth D of the trench structure of at least 10 µm, the modified substrate regions generated during the Stealth Dicing action are sufficiently far away from electronic structures 230a, 230b, such as transistors, diodes, etc. that are typically found in the chips 120a, 120b. In this manner, virtually no modification of the electrical properties of the semiconductor devices 230a, 230b will occur during the action of irradiating the substrate with the laser beam.

The stack of metals that is etched away to perform the trench structure can be positioned with the same precision as the semiconductor structures created in the chips 120a, 120b. During the action of irradiating the substrate with a laser beam, as will be explained below with respect to FIG. 3H or FIG. 3I, a camera may see the presence of the trenches or slits which are on a lower surface. In this manner, a highly precise positioning of the Stealth Dicing tool can be obtained.

FIG. 3E also shows the result of a plasma dry etch of the wafer substrate to form a trench slit around each chip.

Figure 3F:
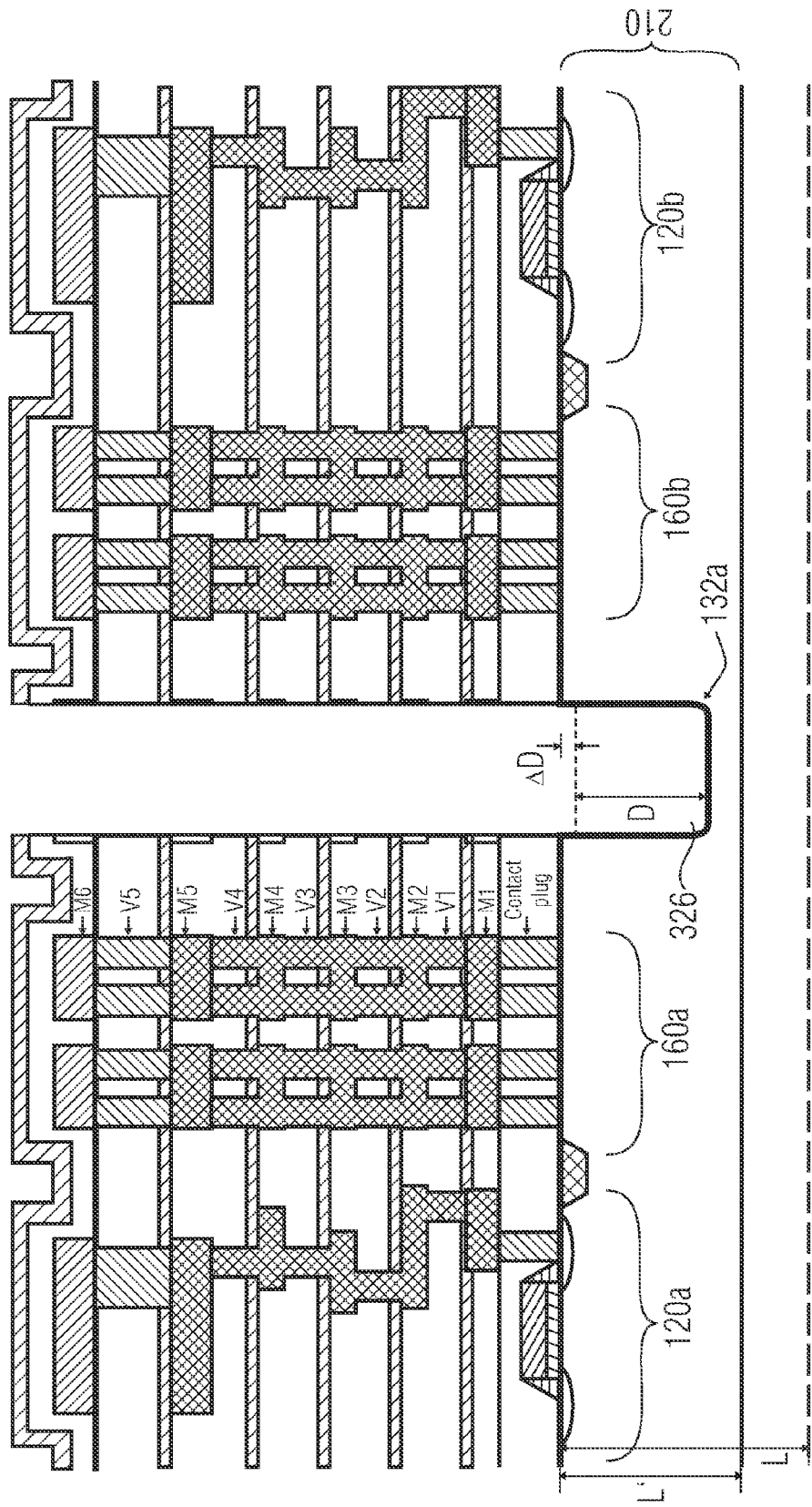

FIG. 3F shows the result of an ensuing thinning process of the wafer 210 from the second surface 214, so that the substrate comprises a thickness L' which is, in general, larger than the depth D of the part 326 of the substrate 210 removed in the previous step. This thinning process to reduce the thickness of the substrate 210 from an initial value L to a smaller value L' is optional. Hence, a wafer backside grinding is performed to reduce the wafer substrate thickness to the needed value (optional step).

Figure 3G:
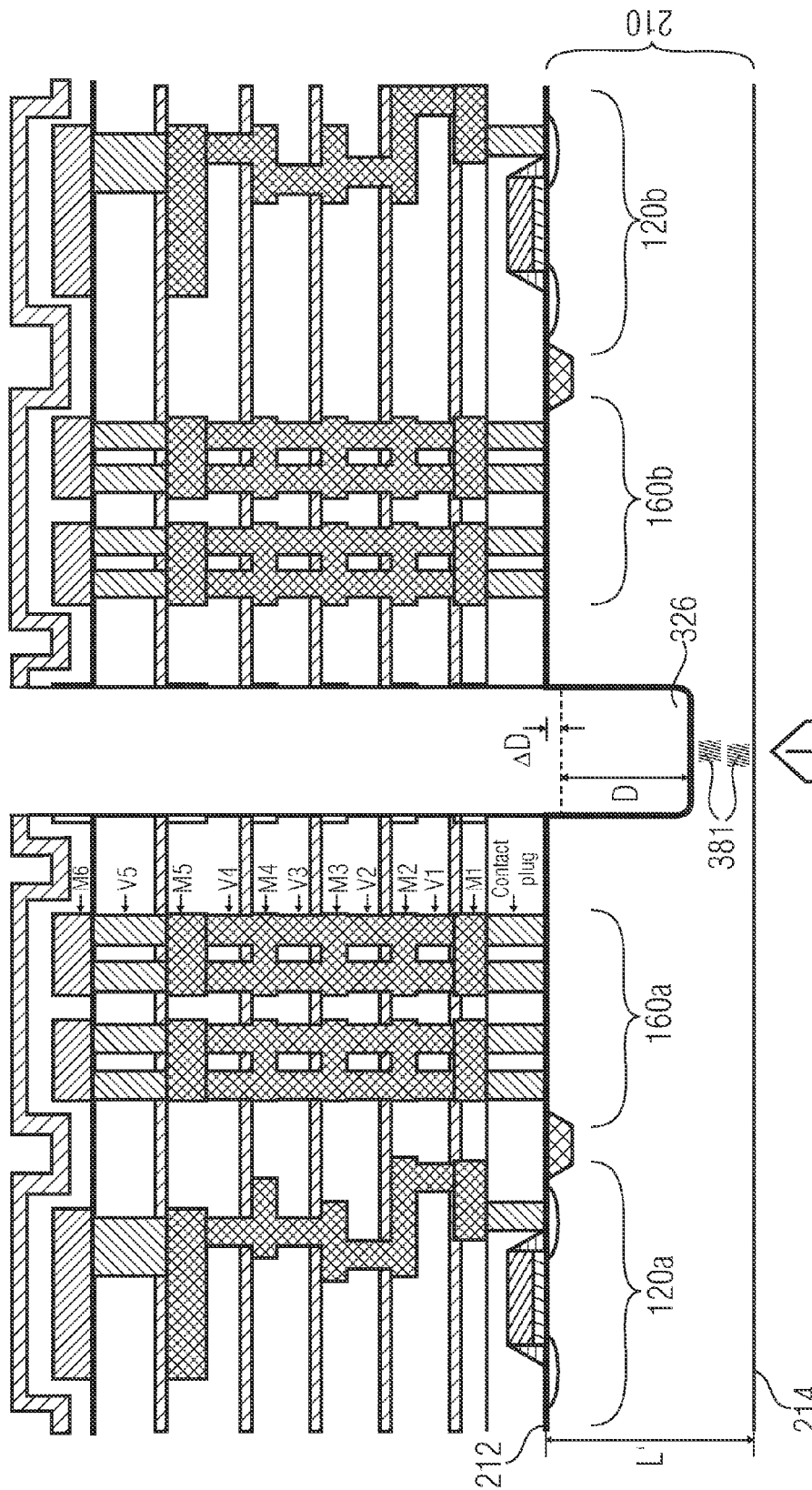

FIG. 3G shows an action of the wafer dicing process in which a laser backside Stealth Dicing is performed. A laser source 380 creates a laser beam that is focused to a depth within the substrate 210 between a bottom of the part 326 which forms a trench structure and the second main surface 214. The second main surface 214 is typically opposite to the first main surface 212. Note that depending on whether the optional grinding action shown in FIG. 3F has been performed or not, the distance between the first main surface 212 and the second main surface 214 may be either the original value L or the reduced value L'.

The laser beam focused at the substrate region between the trench structure 326 and the second main surface 214 may locally modify the substrate material in the vicinity of the focal point if the power of the laser beam is in a certain power range. In particular, the laser beam may modify the substrate material by converting the initially mono-crystalline substrate material to a poly-crystalline structure. FIG. 3G shows two modified regions 381 obtained by focusing the laser beam at two different depths within the bulk of the substrate 210. A single modified region 381 could also be employed, or a number of modified regions larger than two. Typically, the modified region 381 is line-shaped in the direction perpendicular to the drawing plane of FIG. 3G.

A Stealth Dicing tool used to perform the action of laser backside Stealth Dicing may comprise alignment features that are typically assisted by an infrared camera. The alignment features of the Stealth Dicing tool will be able to align the laser shooting to the bottom of the trench structure 326 formed in the action illustrated in FIG. 3F.

The stack of metals that is etched away to perform the trench structure can be positioned with the same precision as the semiconductor structures created in the chips 120a, 120b. During the action of irradiating the substrate with a laser beam, a camera may see the presence of the trenches or slits which are on a lower surface. In this manner, a highly precise positioning of the Stealth Dicing tool can be obtained.

The chips shall be singulated once processed through the expander module of the Stealth Dicing tool, as will be explained in the context of the description of FIG. 4.

Figure 3H:
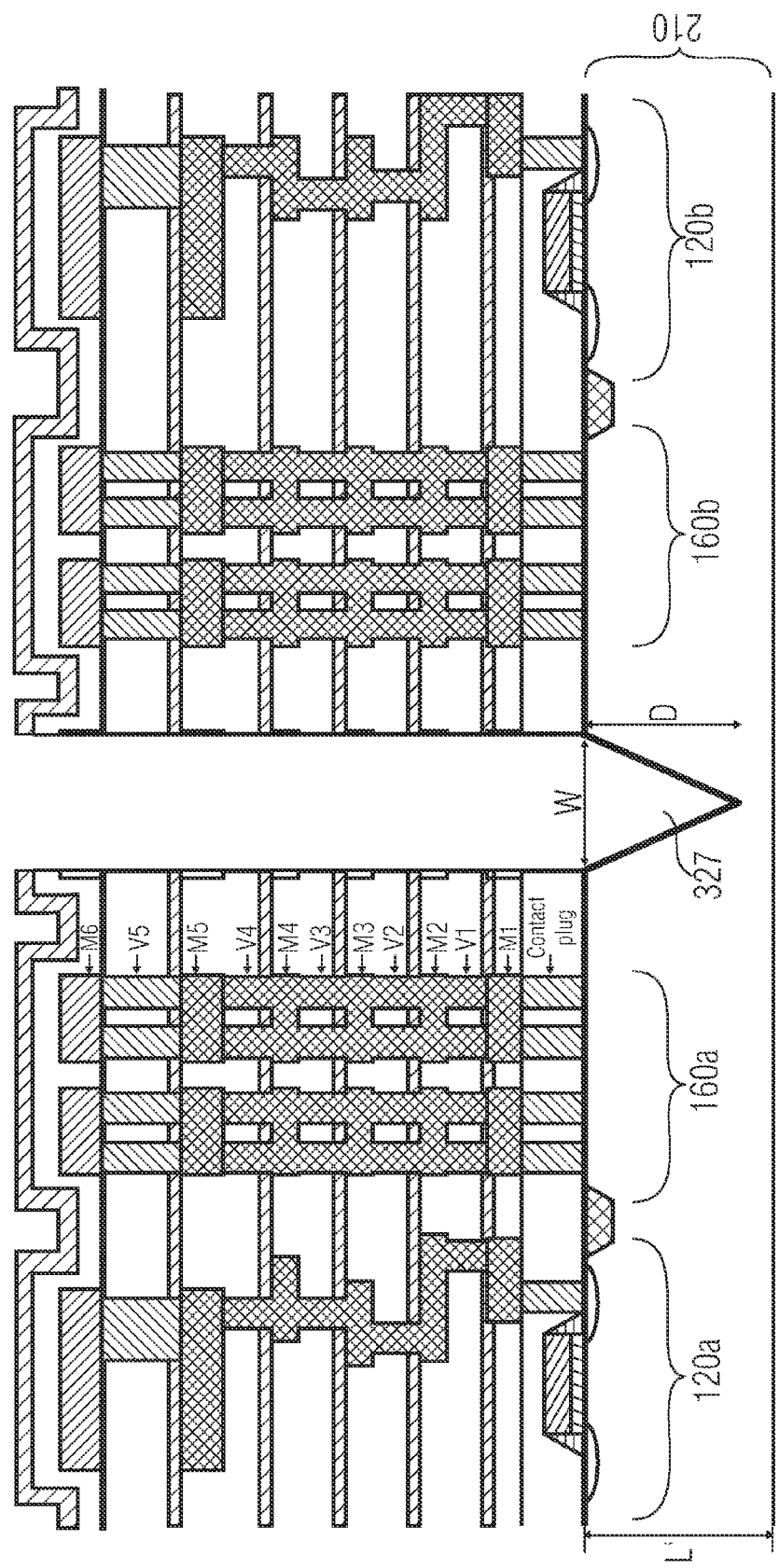
FIGS. 3H-3I show two possible alternative actions within the possible process flow for dicing a wafer.
Figure 3I:
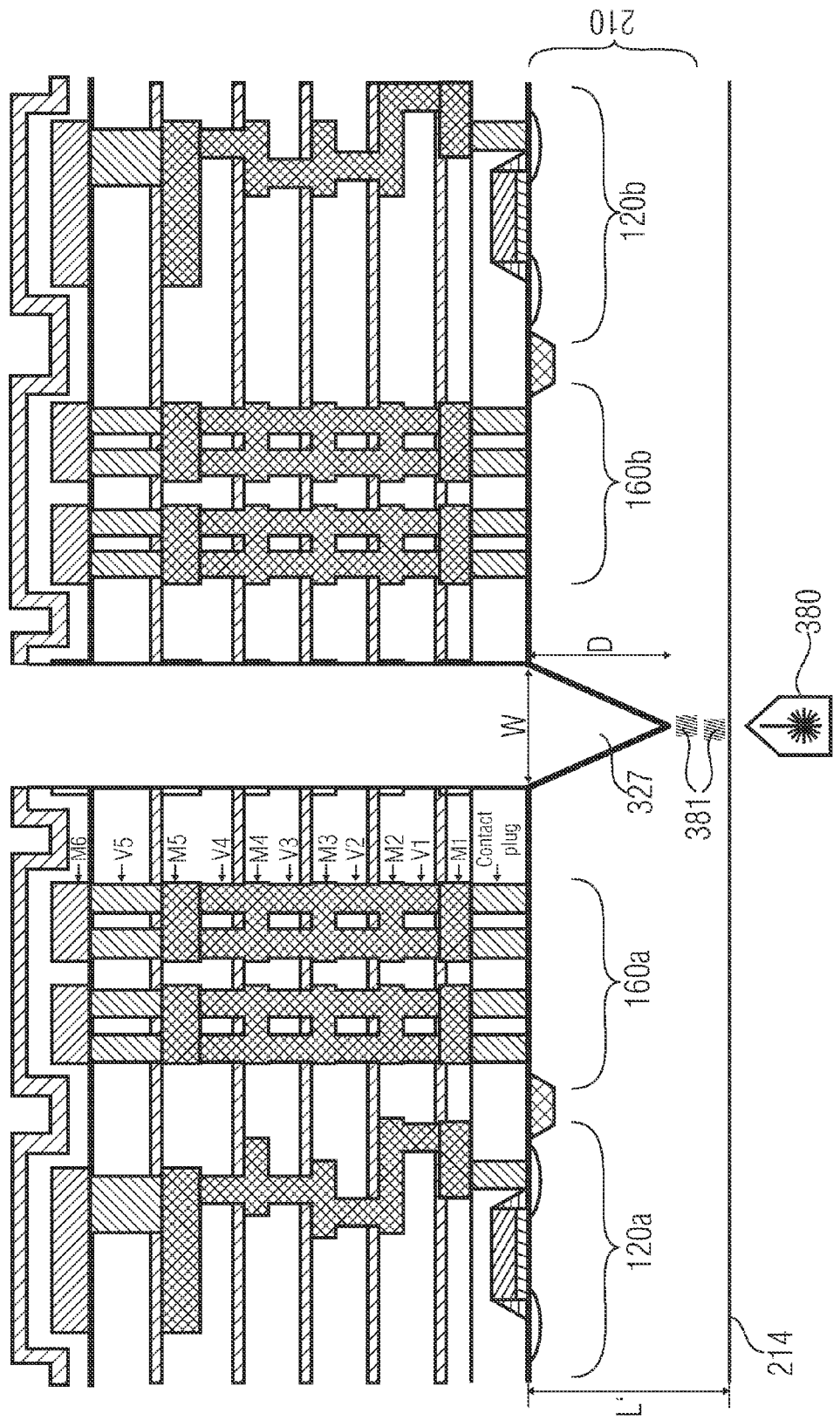

As an alternative to the actions corresponding to FIGS. 3F and 3G, the actions illustrated in FIGS. 3H and 3I may be performed. Instead of performing a plasma dry etch of the wafer substrate 210 to form a trench slit around each chip, a wet chemical etch (based on a suitable KOH solution) may be performed. Due to anisotropic etching properties of the KOH solution, the resulting trench slit 327 will have a V-shaped profile. The result of the wet chemical etch is shown in FIG. 3H. A typical ratio between the width W and the depth D of the V-shaped profile may be D=0.7 W.

The action illustrated in FIG. 3I corresponds by and large to the action illustrated in FIG. 3G. The laser source 380 produces a laser beam focused at a depth within the bulk of the substrate 210 between the trench structure 327 and the second main surface 214 of the substrate 210. Two modified substrate regions 381 are illustrated in FIG. 3I, which are vertically aligned to the tip of the trench structure 327. Note that the size of the modified regions 381 is not necessary to scale with, for example, the width W of the trench structure 327. For example, the modified regions 381 could be as wide or even wider than the width W of the trench structure 327.

According to some embodiments of the teachings disclosed here, a continuous portion, which may be either metal or a dielectric material, is defined around each chip, i.e., along the scribe-lines. This continuous portion is then etched by means of a selective etching process, so that any surrounding material is not or only negligibly affected by the selective etching process. When the etching process reaches the first main surface of the substrate, an over-etch is performed to form a trench. In the alternative, another etching process may be used which etches especially the substrate material. A subsequent Stealth Dicing action is typically performed from the backside of the substrate, i.e., from the side of the second main surface 214. However, the Stealth Dicing could also be performed from the front side of the wafer.

FIG. 4 illustrates a number of actions performed during a second part of the wafer dicing process according to the teachings disclosed herein. The actions illustrated in FIG. 4 begin after all etching actions have been performed on the wafer, i.e., either subsequent to the state illustrated in FIG. 3F or subsequent to the state illustrated in FIG. 3H.

In FIG. 4A the wafer 110 is mounted to a wafer mounter 410. In the example shown in FIG. 4, the wafer 110 is an 8" wafer. The wafer mounter 410 is fixed to an 8" frame 412.

FIG. 4B corresponds to FIG. 3G or 3I. The wafer 110 which is placed upside down on the wafer mounter 410 undergoes a Stealth Dicing operation using the laser source 380. Note that at this stage the wafer 110 is not yet actually singulated, but only weakened at the intended dicing location due to the Stealth Dicing action and the previously formed trench structures.

The actual singulation is performed during an action illustrated in FIG. 4C. The wafer mounter 410 is expanded by means of a clamp ring 413, a breaking tool 414 may be slid across the lower surface of the wafer mounter 410 which is opposite to the surface where the wafer 110 is placed. The breaking tool 414 locally deflect the wafer mounter 410 and the wafer 110 which causes the wafer 110 to break at the intended singulation locations, if breaking has not yet occurred due to the extension of the wafer mounter 410. The actions shown in FIG. 4C result in individual, singulated chips 120a, 120b.

Depending on the desired package or shipping of the individual, singulated chips 120a, 120b, etc., different options exist for handling the chips 120a, 120b, . . . .

FIG. 4 illustrates two of these options. A first option is shown in FIG. 4D. While still being on the wafer mounter 410, the singulated chips are irradiated with ultraviolet light. When the wafer is placed on the mounter (FIG. 4A), it may be held by a special adhesive tape which has the property to highly reduce its adhesion strength when irradiated by a suitable dose of ultraviolet (UV) energy. In a subsequent step shown in FIG. 4E the individual, singulated chips are processed by a die bonder. The die bonder is the tool that picks the singulated chips and executes the wire bonding process.

Another option illustrated in FIG. 4F consists in remounting the singulated chips 120a, 120b to another support 415 from which they may be picked during an assembly of electronic devices, for example.

The wafer dicing process described herein results in a high dicing quality. To mention the most important figures of merit: very sharp chip sidewalls, virtually no cracks, virtually no chipping, virtually no pad corrosion, no wafer dust on chip surface, virtually no delamination of the top layers of the chip.

In contrast to mechanical blade dicing, the singulation process is not limited to squared or rectangular chip shapes or to rectangular singulation lines extending across the entire wafer. Instead, chips of all shapes can be singulated, especially if the Stealth Dicing tool was modified to support arbitrary shapes of the singulation lines.

A high utilization percentage of wafer area is achieved, especially when the kerf width is reduced to ≤2 μm.

Since no critical dimensional control is required to perform the needed wafer manufacturing operations once the etching is finished, one benefit of the teachings disclosed herein consists in the fact that the necessary tools do not need to be particularly advanced (at least, with respect to the current technological status). The tools could be fully depreciated, therefore minimizing the manufacturing costs of the operations.

The classical dicing tools based on high-speed rotating blades are not needed any longer. They may be replaced with the Stealth Laser dicing tools.

Due to the presence of the deep trench, the dicing speed of the Stealth Dicing tool is higher than in a case without a trench (less laser pulse passes are needed).

Due to the presence of the trench, the separation line between chips at the wafer surface is much more precise than in the case without a trench (especially in the case of rotated silicon wafers).

Figure 5:
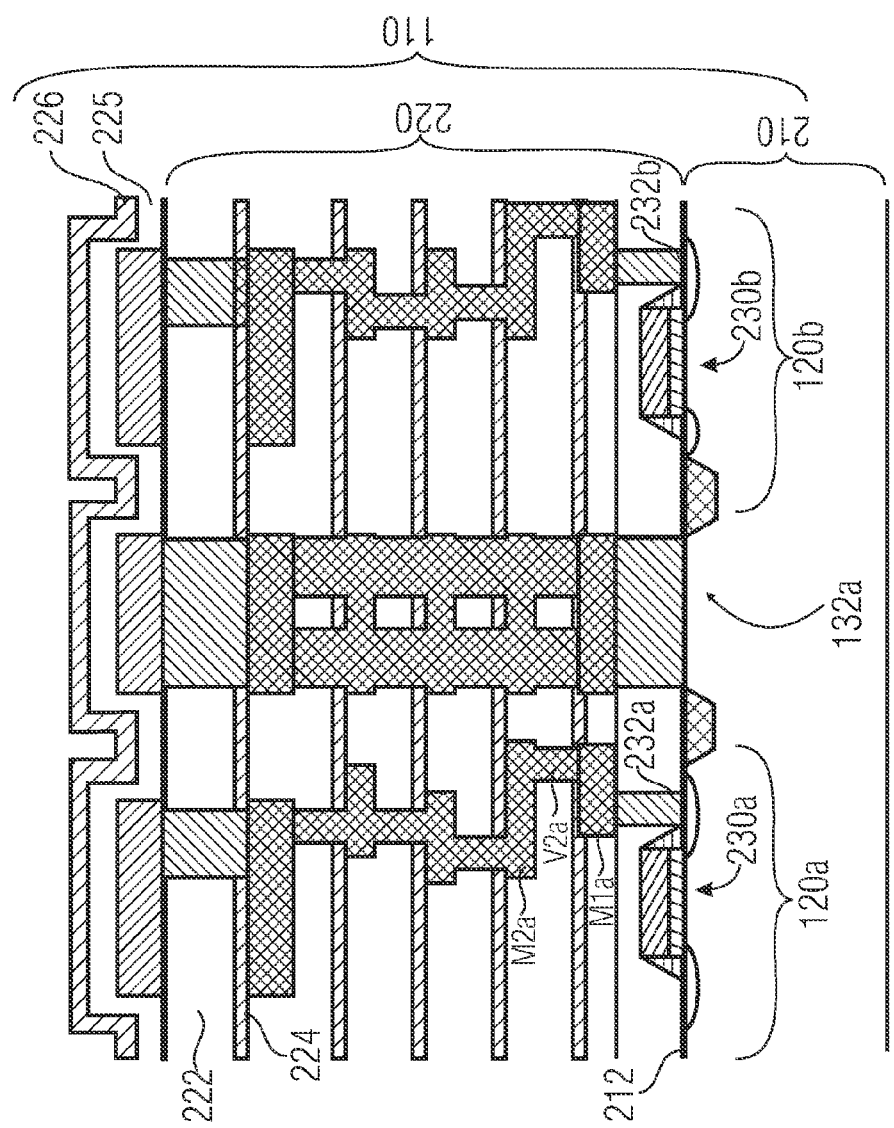
FIG. 5 shows a cross section through a kerf region of a wafer according to another embodiment of the teachings disclosed herein.

FIG. 5 shows a cross-section of a wafer 110 similar to the cross-section of the wafer shown in FIG. 3A. However, in comparison to the structure shown in FIG. 3A, the total kerf width is further reduced by omitting the seal rings 160a, 160b. As mentioned above, it is possible to obtain very sharp chip sidewalls and the risk of cracking, chipping, pad corrosion or de-lamination of the top layers of the chip is substantially reduced. Instead of omitting the seal rings 160a, 160b completely, it may also be possible to reduce the lateral dimension of the seal rings, for example, to half of the size of the seal rings 160a, 160b, shown in FIG. 3A.

Figure 6:
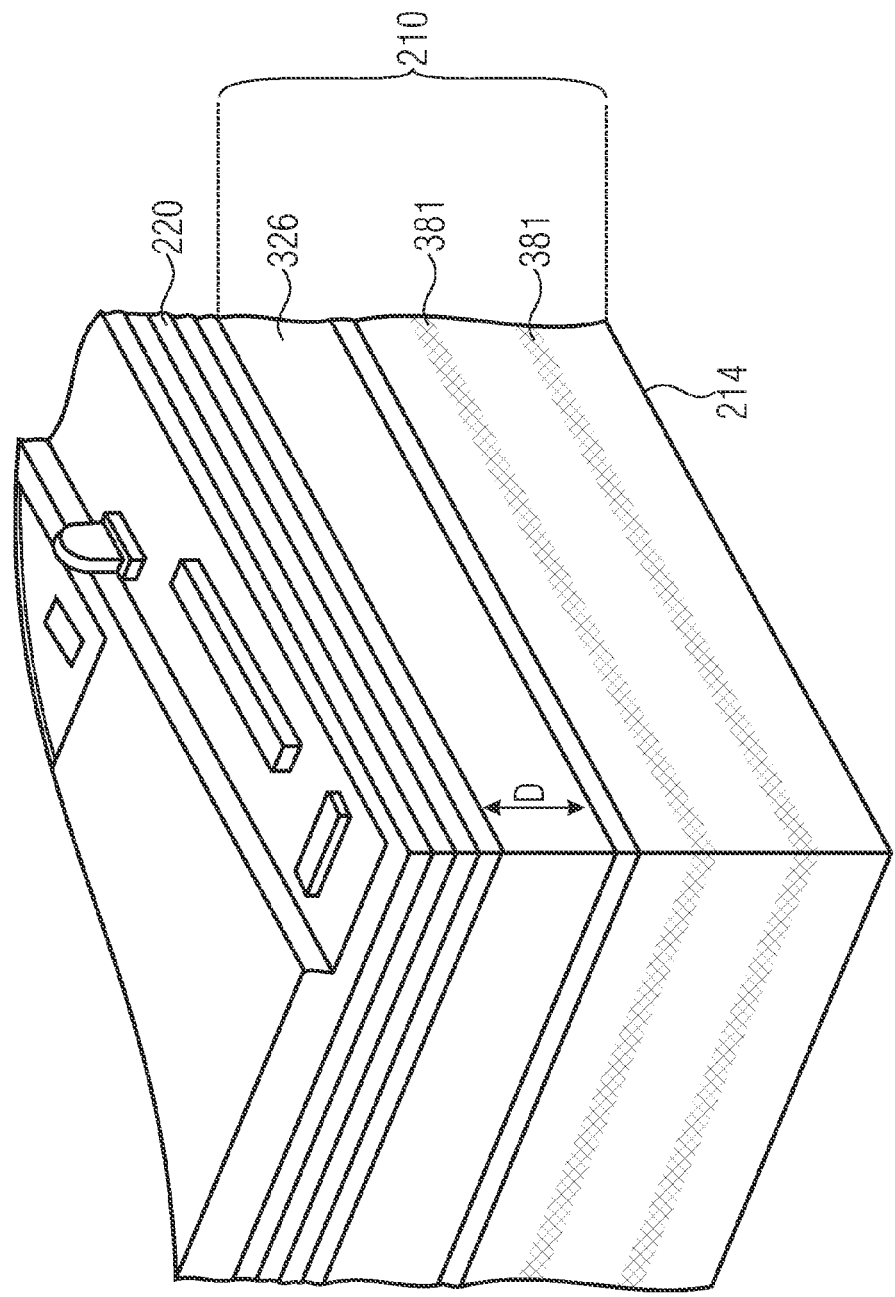
FIG. 6 shows a partial perspective view of a semiconductor device singulated using the method of dicing according to the teachings disclosed herein.

FIG. 6 shows a partial perspective view of a singulated semiconductor device obtained using a wafer dicing method according to the teachings disclosed herein. The semiconductor device comprises the substrate 210 and the layer stack 220. On the upper main surface of the layer stack 220, a number of structures are schematically represented that are not further specified. For example, these structures could be connection pads. At the lateral surface or side surface of the substrate, two regions can be observed. An upper region corresponds to the removed part 326 obtained during the etching of the substrate 210. In accordance with FIG. 3E, this region has a height of D (or D+ΔD, to be more precise).

A second region of the sidewall of the semiconductor device is located between a bottom of the former trench structure 326 and a second main surface 214 of the substrate 210. The former bottom of the trench structure 326 might still be observable as a small pedestal; however, this is not necessarily the case. The second region of the sidewall of the substrate 210 comprises one or more modified substrate regions 381 in the form of lines on the side surface extending in directions parallel to the first and second main surfaces 212, 214. The modified substrate region 381 may be viewable as lines of stress generated by the Stealth Laser pulses using a conventional microscope or an electron microscope.

The upper region of the sidewall of the substrate 210 corresponding to the former trench structure 326 is substantially flush with a sidewall of the layer stack 220.

The Stealth Laser pulses typically leave a clear sign of their application as proven by the presence of darker and rougher lines visible by inspecting the edges of singulated chips using, e.g., an electron microscope. Furthermore, the sharpness of the edges of the chips is a sign that no classical mechanical sawing (blade dicing) has been utilized.

An inspection of the sides of the chip from the upper silicon face down for a few micron may typically reveal a very smooth surface, sign of the dry plasma trench etch.

An inspection of back-end-of-line stack may typically reveal a kind of zigzag profile, sign of the original presence of the Metal Stack Kerf (see, for example, FIG. 3D).

Therefore, by means of suitable decapsulation techniques, it may be possible to determine if the Stealth Laser dicing in conjunction with a Metal Stack Kerf and Silicon Plasma Trench etch has been applied.

The method of dicing a semiconductor wafer according to the teachings disclosed herein may be used by semiconductor manufacturing companies, such as foundries and integrated device manufacturers (IDM). In particular, the teachings disclosed herein may be used for products whose area is less than approximately 3×3 mm$^2$, products/chips of different sizes arranged in an irregular matrix on shared reticles, or products requiring particular dicing quality. A method of dicing a semiconductor wafer according to the teachings disclosed herein may be particularly economically convenient for small area products, i.e., less than approximately 3×3 mm$^2$ mentioned above. The size of the chips may be, for example, 1 mm$^2$, 0.25 mm$^2$, 0.16 mm$^2$, or 0.1225 mm$^2$, for example. Using the teachings disclosed herein, the individual chip may be positioned closely to each other on the wafer 110.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some, one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method of dicing a semiconductor wafer, the method comprising:
    forming a layer stack on a first main surface of a substrate, the layer stack comprising a final passivation layer and a metal region at an intended lateral dicing location, wherein no seal ring is provided between adjacent chips of the semiconductor wafer;
    forming a photoresist layer on the final passivation layer;
    performing a photolithographic process to selectively remove the photoresist layer at a location that is substantially aligned to the metal region;
    etching the final passivation layer at the location that is substantially aligned to the metal region due to the photolithographic process;
    etching the metal region of the layer stack to expose the first main surface of the substrate at the intended lateral dicing location;
    etching the substrate through an opening in the layer stack obtained during the etching of the metal region to obtain a trench structure in the substrate;
    irradiating the substrate with a laser beam to locally modify the substrate between a bottom of the trench structure and a second main surface of the substrate opposite to the first main surface; and
    singulating individual chips.

2. The method of claim 1, wherein etching the substrate comprises chemically wet etching the substrate through the opening in the layer stack obtained.

3. The method of claim 1, wherein etching the substrate comprises dry plasma etching the substrate through the opening in the layer stack obtained.

4. The method of claim 1, wherein irradiating the substrate comprises focusing the laser beam successively at a plurality of depths within the substrate to obtain a distributed or enlarged modified substrate region.

\* \* \* \* \*